(12) United States Patent
Chee

(10) Patent No.: US 8,433,078 B2
(45) Date of Patent: Apr. 30, 2013

(54) HIGH PERCEIVED AUDIO QUALITY CLASS D AMPLIFIER

(75) Inventor: San Hwa Chee, Fremont, CA (US)

(73) Assignee: Monolithic Power Systems, Inc., San Jose, CA (US)

( * ) Notice: Subject to any disclaimer, the term of this patent is extended or adjusted under 35 U.S.C. 154(b) by 800 days.

(21) Appl. No.: 12/606,010

(22) Filed: Oct. 26, 2009

(65) Prior Publication Data

US 2011/0096944 A1    Apr. 28, 2011

(51) Int. Cl.
*H04B 15/00*   (2006.01)
*H03F 1/14*    (2006.01)
*H03F 3/217*   (2006.01)

(52) U.S. Cl.
USPC .............................. 381/94.5; 330/51; 330/251

(58) Field of Classification Search ................. 381/94.5, 381/120; 330/10, 51, 251, 207 A
See application file for complete search history.

(56) References Cited

U.S. PATENT DOCUMENTS 7,427,893 B2 *   9/2008   Liu et al. .......................... 330/51

* cited by examiner

*Primary Examiner* — Duc Nguyen
*Assistant Examiner* — Kile Blair
(74) *Attorney, Agent, or Firm* — Perkins Coie LLP

(57) ABSTRACT

An audio amplifier and a method of operating such an amplifier are disclosed. The audio amplifier includes a switch disabling controller and/or an output set-point controller. The switch disabling controller is configured to disable switching of an output switch circuit or other switch circuit while an input signal represents at least relative silence. The output set-point controller is configured to bring and/or hold first and second switch nodes toward and/or at a set-point voltage while the input signal represents at least relative silence.

20 Claims, 7 Drawing Sheets

HIGH PERCEIVED AUDIO QUALITY CLASS D AMPLIFIER

TECHNICAL FIELD

The present disclosure is directed to audio devices and processes, for example, to audio amplifiers and the operations thereof.

BACKGROUND

Audio amplifiers are widely employed for a variety of applications. For example, audio amplifiers are commonly employed in music devices, computers, televisions, telephones, and/or the like. Listeners of such devices generally prefer high quality audio outputs. As such, characteristics such as frequency response, total harmonic distortion (THD), signal to noise ratio (SNR), perceived audio quality (e.g., perceptual evaluation of audio quality (PEAQ), mean opinion score (MOS), etc.), and/or the like may be employed to characterize an audio amplifier.

One type of undesirable noise includes "pops" or "clicks" that may be generated, for example, by initial switching of an audio amplifier's output, or other switching circuit (e.g., when unmuting the output, during start-up, etc.). In the context of an audio system, this type of switching noise may distract a listener, especially since this initial switching follows periods of relative silence (e.g., start of musical tracks, when unmuting, following musical lulls, start-up, or periods of silence, or following periods for which an audio output is below a threshold, etc.).

Certain audio amplifier topologies (e.g., class D audio amplifiers, amplifiers with complementary switch circuits, etc.) may be more likely to produce noticeable pops or clicks than others. As one example, non-linear switching waveforms in class D amplifiers may generate transients at the speaker that cause pops or clicks. Likewise, amplifiers with complementary output stages may also provide relatively larger transients at the speaker due to the increased output range typically associated with complementary output stages.

BRIEF DESCRIPTION OF THE DRAWINGS

Non-limiting and non-exhaustive embodiments of the present invention are described with reference to the following drawings. In the drawings, like reference numerals refer to like parts throughout the various figures unless otherwise specified.

For a better understanding of the present invention, reference will be made to the following Detailed Description, which is to be read in association with the accompanying drawings, wherein.

DETAILED DESCRIPTION

Figure 1:
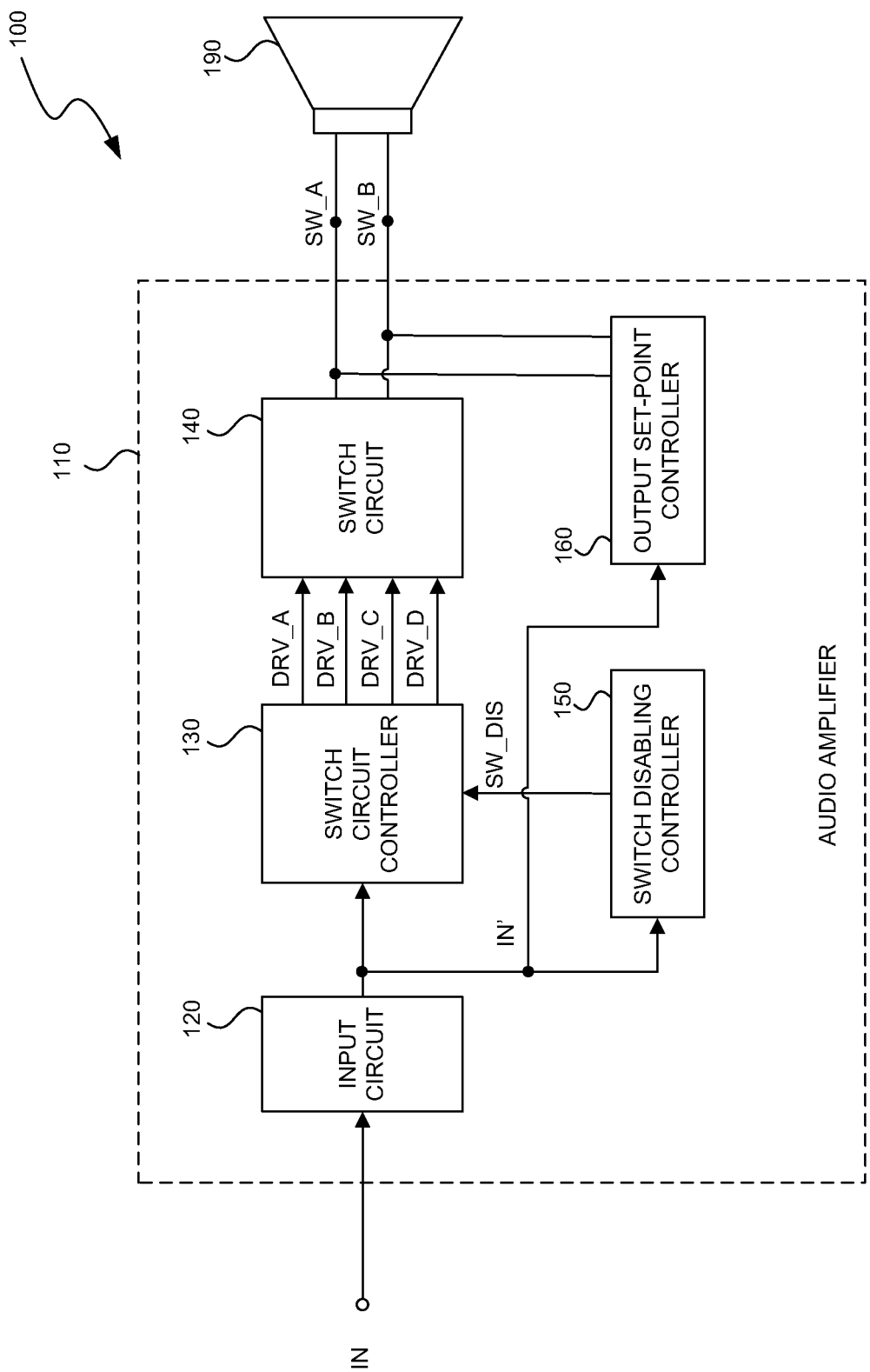
FIG. 1 is a diagram of an embodiment of an audio system according to aspects of the invention.

The following description provides specific details for a thorough understanding of, and enabling description for, various embodiments of the technology. One skilled in the art will understand that the technology may be practiced without many of these details. In some instances, well-known structures and functions have not been shown or described in detail to avoid unnecessarily obscuring the description of the embodiments of the technology. It is intended that the terminology used in the description presented below be interpreted in its broadest reasonable manner, even though it is being used in conjunction with a detailed description of certain embodiments of the technology. Although certain terms may be emphasized below, any terminology intended to be interpreted in any restricted manner will be overtly and specifically defined as such in this Detailed Description section. The terms "based on," "based upon," "according to," and/or the like are not exclusive and are equivalent to the term "based, at least in part, on" or similar and include being based on/according to additional factors, some of which are not described herein. References in the singular are made merely for clarity of reading and include plural references unless plural references are specifically excluded. The term "or" is an inclusive "or" operator and is equivalent to the term "and/or" unless specifically indicated otherwise. The term "coupled" means at least either a direct electrical connection between the items connected, or an indirect connection through one or more passive or active intermediary devices. The term "circuit" means at least either a single component or a multiplicity of components, either active and/or passive, that are coupled together to provide a desired function or functions. The term "signal" means at least one current, voltage, charge, temperature, data, or other signal. A "signal" may be used to communicate using active high, active low, time multiplexed, synchronous, asynchronous, differential, complementary, single-ended, or any other digital or analog signaling or modulation technique. Where either a field effect transistor (FET), a bipolar transistor, and/or the like may be employed as an embodiment of a transistor or switching device, the scope of the words "gate," "drain," and "source" includes "base," "collector," and "emitter," respectively, and vice versa. In the description that follows, the scope of the term "some embodiments" is not to be so limited as to mean more than one embodiment, but rather, the scope may include one embodiment, more than one embodiment, or perhaps all embodiments.

An audio amplifier and a method of operating such an amplifier are disclosed. The audio amplifier includes a switch disabling controller and/or an output set-point controller. The switch disabling controller is configured to disable switching of an output switch circuit or other switch circuit while an input signal represents at least relative silence. The output set-point controller is configured to bring and/or hold first and second switch nodes toward and/or at a set-point voltage while the input signal represents at least relative silence.

The technology disclosed herein may be employed in an audio amplifier to increase listener perceptions of audio quality while reducing listener perceptions of switching noise. For example, high perceived audio quality and low perceived switching noise may be provided by eliminating/suppressing switching noise. In one embodiment, switching noise may be eliminated during periods of relative silence and reduced during other periods. For example, the perceptibility of pops and clicks may be eliminated by stopping amplifier switching during periods of relative silence and by masking the pops and clicks in output audio, such as music, during other periods.

FIG. 1 is a diagram of audio system 100. Audio system 100 includes audio amplifier 110 and speaker 190. As discussed above, audio system 100 may be employed in music devices, computers, televisions, or telephones. However, audio system 100 may be employed in other types of devices.

As illustrated, audio amplifier 110 includes input circuit 120, switch circuit controller 130, switch circuit 140, switch disabling controller 150, and output set-point controller 160. Audio amplifier 110 is configured to drive speaker 190 at switch nodes SW_A and SW_B based on input signal IN.

Audio amplifier 110 may be any type of suitable audio amplifier. For example, audio amplifier 110 may be a class A, class B, class AB, class D, or other amplifier. In one embodiment, audio amplifier 110 is a self-oscillating AD modulated class D audio amplifier connected to a bridge tied load.

Input circuit 120 is configured to receive input signal IN and to generate waveform signal IN' based on input signal IN. As one example, input circuit 120 may include analog input stages (e.g., modulators, preamplifiers, filters, gain controls, frequency controls, etc.) that generate a suitable waveform signal IN' for use by switch circuit controller 130. However, input circuit 120 may alternately include minimal or no circuitry and provide input signal IN directly to switch circuit controller 130 as waveform signal IN'.

If employed in a digital input amplifier, input circuit 120 may provide waveform signal IN' as a digitally modulated signal such as a pulse width modulated (PWM) signal. In such an embodiment, input circuit 120 may also include decoding logic, control logic, input circuitry, and/or the like configured to receive a digital input signal (e.g., an Integrated Interchip Sound ($I^2S$) signal, a Sony/Philips Digital Interconnect Format (SPDIF) signal, etc.) and to generate waveform signal IN' from the digital input signal. However, if employed with other amplifiers, input circuit 120 may provide waveform signal IN' to switch circuit controller 130 as an analog signal.

Switch circuit controller 130 may be configured to receive waveform signal IN' and to drive switch circuit 140, via switch circuit drive signals DRV_A, DRV_B, DRV_C, and DRV_D, according to waveform signal IN' while input signal IN does not represent relative silence (e.g., active audio signal, music playback, etc.). While input signal IN represents relative silence, switch circuit controller 130 may be configured to hold a state of switch circuit 140 (e.g., suppress switching). As one example, switch circuit controller 130 receives switch disabling signal SW_DIS from switch disabling controller 150. In such an example, switch disabling signal SW_DIS may represent a period of relative silence by being asserted and other periods by being de-asserted. Switch circuit controller 130 may then employ switch disabling signal SW_DIS to selectively disable driving of switch circuit 140.

Switch circuit controller 130 may include drivers, buffers, level shifters/bootstrap circuits, and/or the like to enable driving of switch circuit 140. In addition, switch circuit controller 130 may also include temperature compensation logic, break-before-make logic, dead-time equalization logic, over-current protection, and/or the like.

Switch circuit 140 is configured to be driven, via switch circuit drive signals DRV_A, DRV_B, DRV_C, and DRV_D, by the switch circuit controller 130, and to drive an audio output signal to speaker 190 at switch nodes SW_A and SW_B. Addition details of switch circuit 140 are discussed below with reference to FIG. 3.

As shown, switch disabling controller 150 is configured to determine whether the input signal represents at least relative silence at any given time. Switch disabling controller 150 can then selectively assert or de-assert input signal IN to respectively represent detection of relative silence or an active audio signal. As discussed above, switch disabling signal SW_DIS may then be employed to control the operations of switch circuit controller 130 and switch circuit 140 to suppress switching of switch circuit 140. Switch disabling controller 150 may thus eliminate switching noise during periods of relative silence and mask switching noise into the output audio during other periods.

In one embodiment, output set-point controller 160 is configured to bring, and then hold, switch nodes SW_A and SW_B to a set-point voltage during periods of relative silence. For example, the set-point voltage may be a non-zero common mode voltage that is approximately half of the complementary drive voltage employed to drive the audio output when an active input signal IN is provided to input circuit 120. By employing a common mode set-point voltage, there is substantially (e.g., to circuit or process tolerances) no resulting voltage differential across the speaker, and hence no current through the speaker. In addition, by using a set-point voltage that approximates a steady state voltage of switch nodes SW_A and SW_B while driving an audio output to speaker 190, the noise resulting from the first transition of switch circuit 140 following a relatively quiet period may be reduced. However, any suitable set-point voltage may be employed. Output set-point controller 160 may also optionally provide an output to switch circuit controller 130 to disable switching while switch nodes SW_A and SW_B are held at the set-point voltage (e.g., if switch disabling controller 150 is omitted) (Not shown).

Elements of audio amplifier 110 may be fabricated into an integrated circuit, implemented in a field programmable gate array (FPGA), implemented in software (e.g., with a processor and a processor readable medium), implemented with discrete gates or components, and/or the like. If fabricated into an integrated circuit, switch disabling controller 150 and output set-point controller 160 may be fabricated into a relatively small die area.

Figure 2:
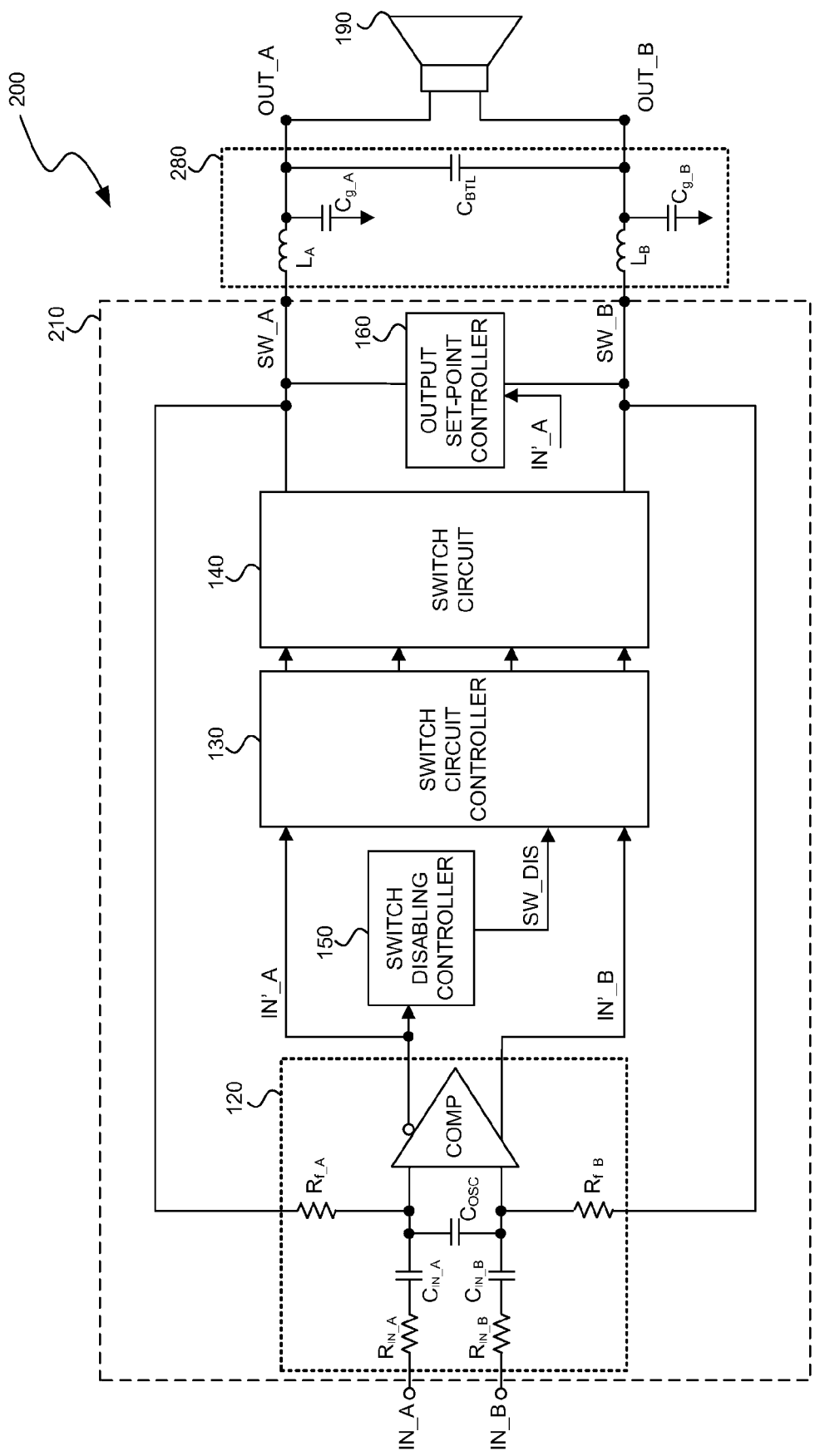
FIG. 2 is a diagram of another embodiment of an audio system according to aspects of the invention.

FIG. 2 is a diagram of audio system 200. Audio system 200 includes audio amplifier 210, output circuit 280, and speaker 190. Audio system 200 may be employed as an embodiment of audio system 100 and audio amplifier 210 may be employed as an embodiment of audio amplifier 110. As illustrated, audio amplifier 210 is self-oscillating AD modulated class D audio amplifier connected to a bridge tied load Audio amplifier 210 includes input circuit 120, switch circuit controller 130, switch circuit 140, switch disabling controller 150, and output set-point controller 160.

Input circuit 120 includes resistors $R_{IN\_A}$, $R_{IN\_B}$, $R_{f\_A}$, and $R_{f\_B}$, capacitors $C_{IN\_A}$, $C_{IN\_B}$, and $C_{OSC}$, and comparator COMP. Input circuit 120 is also configured as a modulation circuit to generate a PWM modulated waveform signals IN'_A and IN'_B based on an analog input received via differential input signals IN_A and IN_B and based on feedback received via resistors $R_{f\_A}$ and $R_{f\_B}$.

In operation, input circuit 120 functions as a self-oscillating input circuit. Ignoring, for the purpose of explanation, switch disabling controller 150 and output set-point controller 160, when differential input signals IN_A and IN_B represent relative silence, waveform signals IN'_A and IN'_B self-oscillate with an approximately 50% duty cycle due to the alternating charging of $C_{OSC}$ from switch nodes SW_A and SW_B via resistors $R_{f\_A}$ and $R_{f\_B}$. For example, when switch node SW_A is high and switch node SW_B is low, capacitor $C_{OSC}$ will charge from switch node SW_A through resistor $R_{f\_A}$. When the voltage across capacitor $C_{OSC}$ becomes sufficient to flip the output of comparator COMP, switch node SW_A becomes low and switch node SW_B becomes high. Capacitor $C_{OSC}$ will then charge from switch node SW_B through resistor $R_{f\_B}$. If, for example, there is an active signal on differential input signals IN_A and IN_B, the active signal will deviate the duty cycle from 50% due to the offset from differential input signals IN_A and IN_B.

During periods in which differential input signals IN_A and IN_B represent relative silence, switch disabling controller 150 is configured to suppress switching (e.g., hold all switches open, maintain a current state of switch circuit 140, etc.), and thus disable self-oscillation of audio amplifier 210. During these periods, output set-point controller 160 is configured to bring, and then hold, switch nodes SW_A and SW_B to a set-point voltage. Output set-point controller 160 may be further configured with a time constant that enables capacitors $C_{g\_A}$, $C_{g\_B}$, and $C_{BTL}$ to be charged to approximately the steady state operating voltage for switch nodes SW_A and SW_B (e.g., to reduce the perceptibility of switching noise upon switching). However, when there is an active signal on differential input signals IN_A and IN_B, switch disabling controller 150 and output set-point controller 160 do not suppress self-oscillation, thus audio amplifier 210 may operate as a self-oscillating amplifier.

In at least one embodiment, comparator COMP is a hysteretic comparator with relatively equal high-to-low and low-to-high hysteresis. However, any suitable comparator may be employed. Likewise, resistors $R_{IN\_A}$, $R_{IN\_B}$, $R_{f\_A}$, and $R_{f\_B}$ and capacitors $C_{IN\_A}$, $C_{IN\_B}$, and $C_{OSC}$ may be of any suitable value or type. As one example, the values of resistors $R_{IN\_A}$, $R_{IN\_B}$, $R_{f\_A}$, and $R_{f\_B}$ and capacitors $C_{IN\_A}$, $C_{IN\_B}$, and $C_{OSC}$ are selected to define the self-oscillating frequency as well as the responsiveness of input circuit 120 to differential input signals IN_A and IN_B.

Output circuit 280 includes inductors $L_A$ and $L_B$ and capacitors $C_{g\_A}$, $C_{g\_B}$, and $C_{BTL}$. As one example, the values of inductors $L_A$ and $L_B$ and capacitors $C_{g\_A}$, $C_{g\_B}$, and $C_{BTL}$ are selected to define filtering and frequency response characteristics of audio system 200. Any suitable values or types of inductors and capacitors may be employed.

As shown in FIGS. 1 and 2, switch disabling controller 150 and output set-point controller 160 are configured to receive waveform signals IN' or IN'_A, for example, to monitor for periods of relative silence. However, in other embodiments, switch disabling controller 150 and output set-point controller 160 may instead monitor for periods of relative silence via other signals (e.g., waveform signal IN'_B, input signals IN, IN_A, or IN_B, etc.). Likewise, switch disabling controller 150 or output set-point controller 160 may also be configured to determine periods of relative silence in other ways (e.g., monitoring a bit stream of a digital input, etc.).

Figure 3:
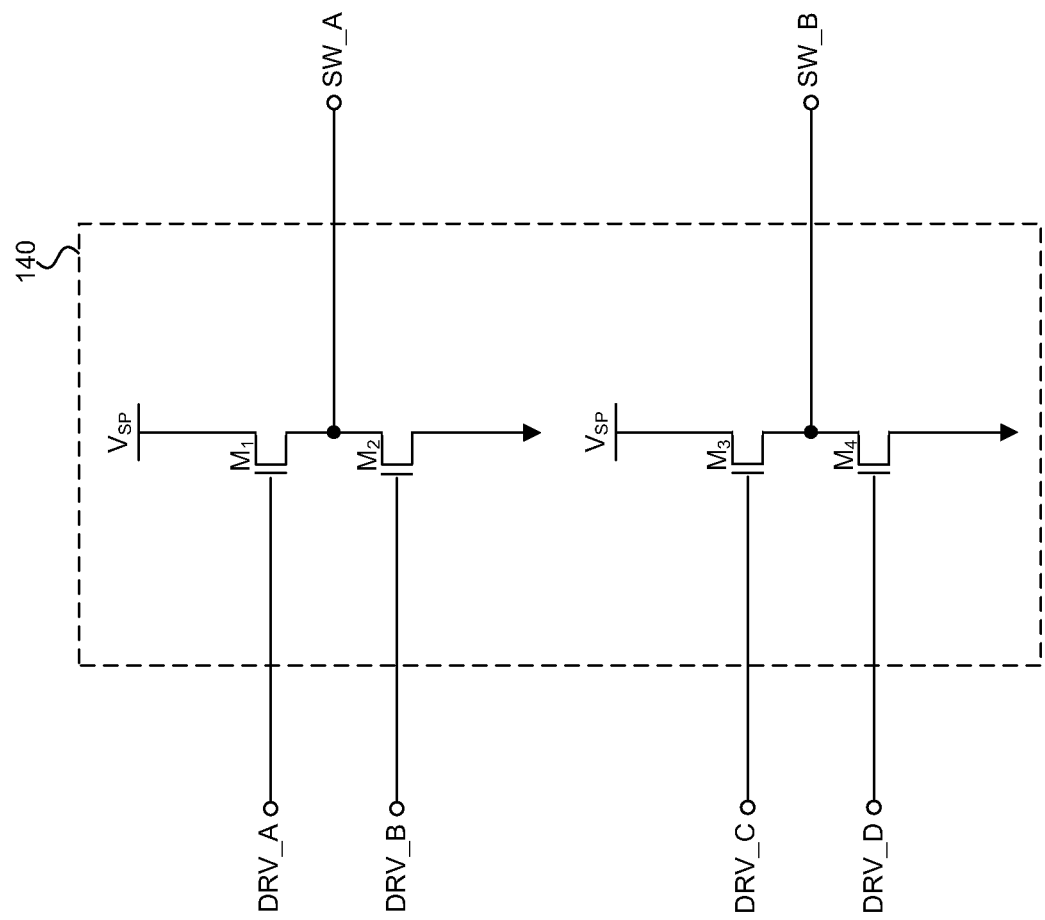
FIG. 3 is a diagram of the switch circuit of FIG. 1 or FIG. 2 according to aspects of the invention.

FIG. 3 is a diagram of switch circuit 140. As illustrated, switch circuit 140 includes switching devices $M_1$-$M_4$, which are configured to drive switch nodes SW_A and SW_B in a complementary fashion (e.g., as a complementary output stage). Switching devices $M_1$-$M_4$ may be any type of suitable transistor or other switching device. For example, switching devices $M_1$-$M_4$ may include metal oxide semiconductor field effect transistors (MOSFETs), junction field effect transistors (JFETs), bipolar junction transistors (BJTs), insulated gate bipolar transistors (IGBTs), metal semiconductor field effect transistors (MESFETs), relays, and/or the like. If transistors are employed as switching devices $M_1$-$M_4$, either N-channel or P-channel transistors may be suitably employed.

Switch circuit 140 may also be operated from any suitable power source(s). Although illustrated as a single supply circuit, suitable switch circuits may also be operated from dual supplies. (Not shown.)

Figure 4:
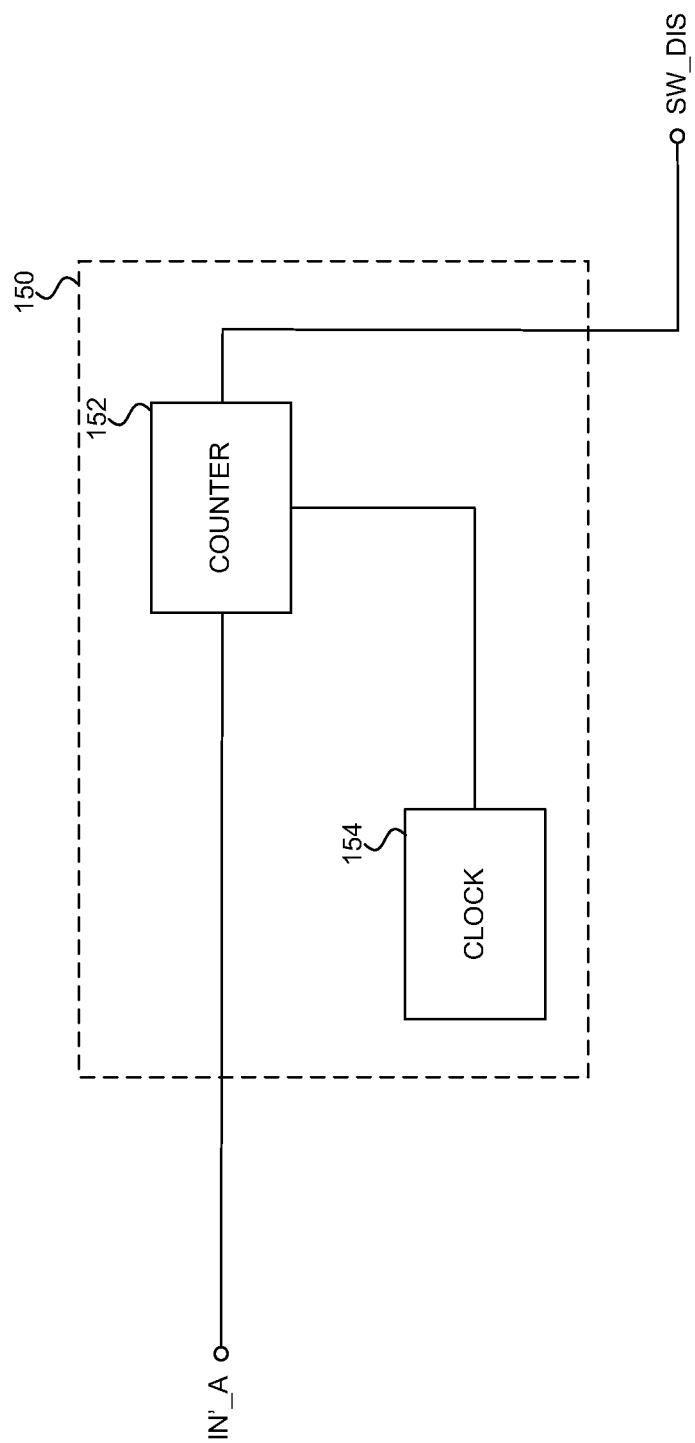
FIG. 4 is a diagram of the switch disabling controller of FIG. 1 or FIG. 2 according to aspects of the invention.

FIG. 4 is a diagram of switch disabling controller 150. As illustrated, switch disabling controller 150 includes counter 152 and clock 154 and is configured to receive waveform signal IN'_A and selectively provide switch disabling signal SW_DIS based on waveform signal IN'_A.

Counter 152 may be configured to count a duration during which waveform signal IN'_A does not represent relative silence, and to de-assert switch disabling signal SW_DIS upon the count reaching a threshold value. Clock 154 may be configured to provide a time base to counter 152 to enable this counting. As one example, suitable threshold values may be a few hundred milliseconds. However, any suitable threshold may be employed.

Figure 5:
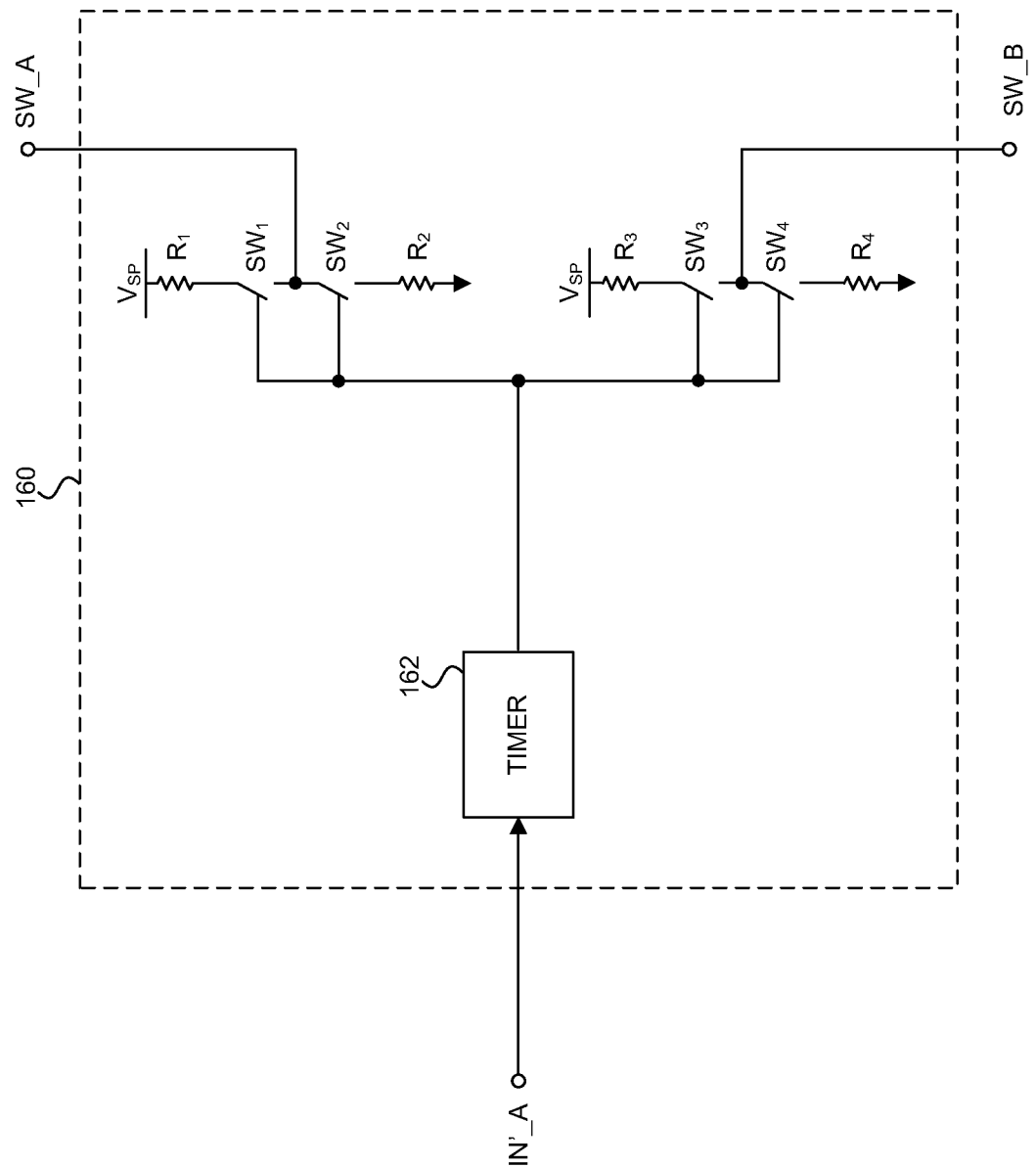
FIG. 5 is a diagram of the output set-point controller of FIG. 1 or FIG. 2 according to aspects of the invention.

FIG. 5 is a diagram of output set-point controller 160. As illustrated, output set-point controller 160 includes timer 162, resistors $R_1$-$R_4$, and switches $SW_1$-$SW_4$.

As shown, resistors $R_1$-$R_4$ and switches $SW_1$-$SW_4$ are arranged as first and second switched voltage divider circuits respectively configured to selectively couple the first and second switch nodes to set-point voltages. The set-point voltages may be defined by the relative resistances of resistors $R_1$-$R_4$. In addition, the values of resistors $R_1$-$R_4$ may also be selected to define any suitable charging time, for example, of capacitors $C_{g\_A}$, $C_{g\_B}$, and $C_{BTL}$ of FIG. 2. In one embodiment, a charging time of 500 milliseconds or one second may be employed.

In addition, timer 162 may be configured to control switches $SW_1$-$SW_4$ to selectively couple the switched voltage divider circuits to switch nodes SW_A and SW_B. As shown, timer 162 is configured to control switches $SW_1$-$SW_4$ based on waveform signal IN'_A. However, in other embodiments, timer 162 may be configured to control switches $SW_1$-$SW_4$ based on a power-on reset circuit, an input signal, another waveform signal, a voltage of switch node SW_A or switch node SW_B, and/or the like.

As with switch circuit 140, output set-point controller 160 may also be operated from any suitable power source(s).

Figure 6:
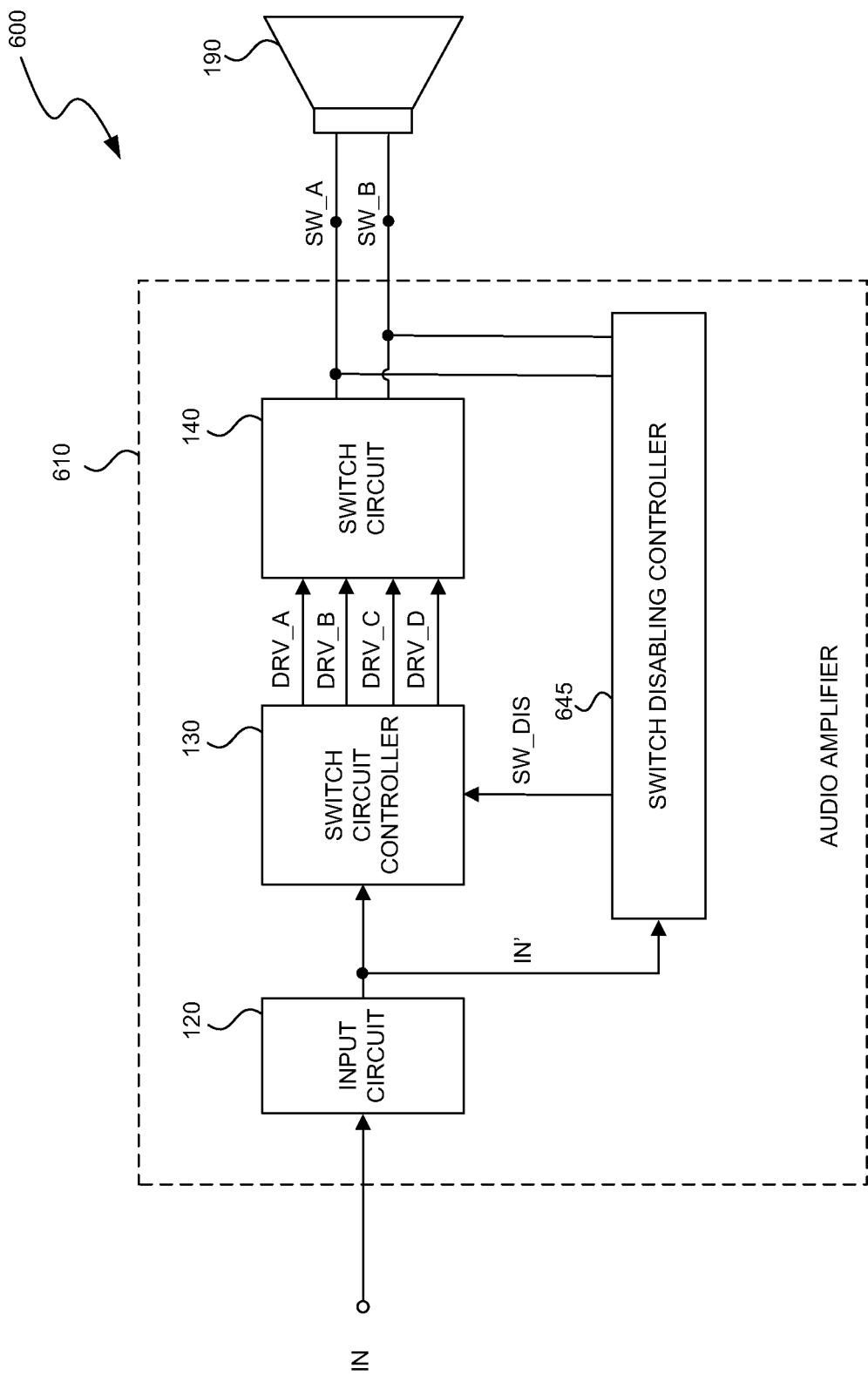
FIG. 6 is a diagram of yet another embodiment of an audio system according to aspects of the invention.

FIG. 6 is a diagram of audio system 600. Audio system 600 includes audio amplifier 610 and speaker 190. Amplifier 610 is similar to audio amplifier 110. However switch disabling controller 150 and output set-point controller 160 are combined into switch disabling controller 645.

Figure 7:
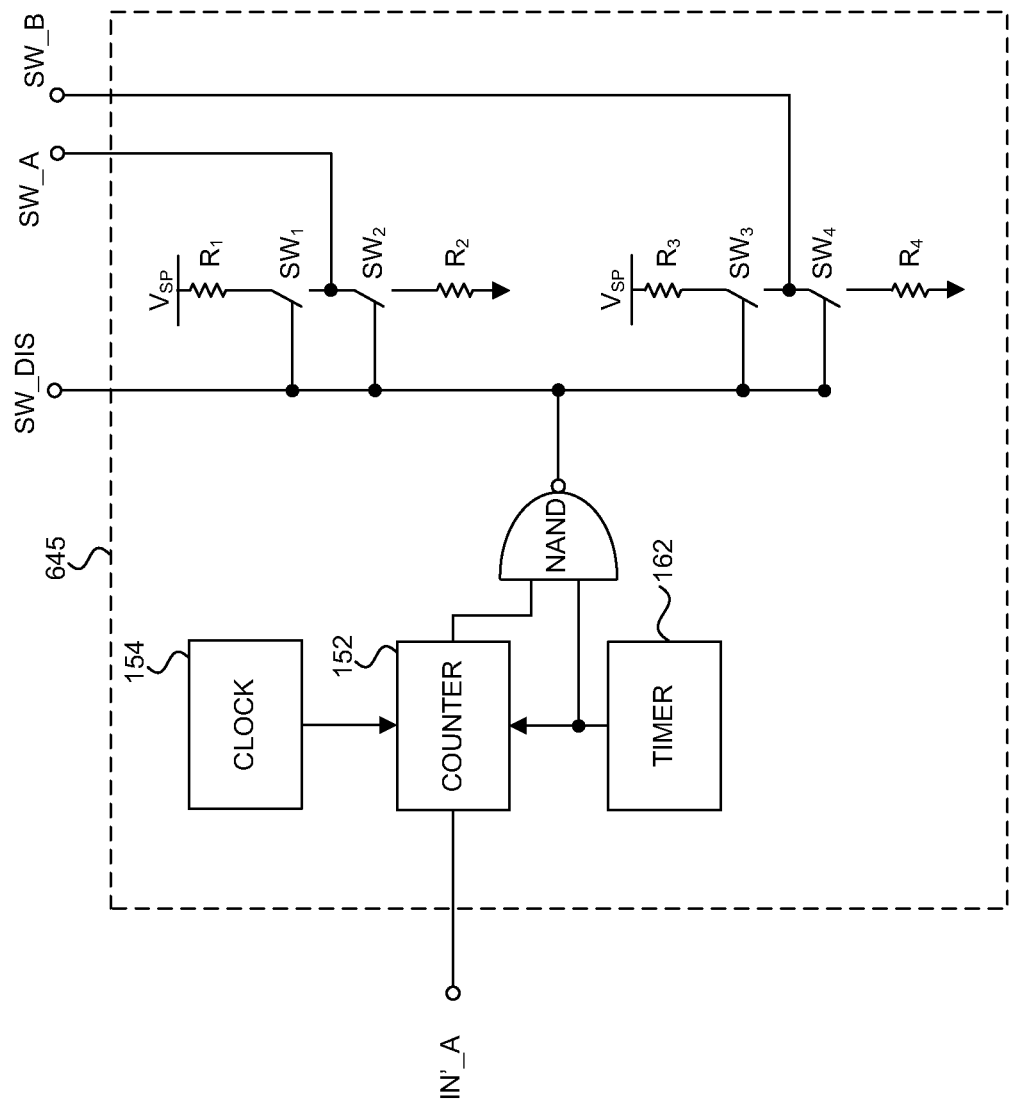
FIG. 7 is a diagram of a switch disabling controller of FIG. 6 according to aspects of the invention.

FIG. 7 is a diagram of switch disabling controller 645. Switch disabling controller 645 includes counter 152, clock 154, timer 162, n and gate NAND, resistors $R_1$-$R_4$, and switches $SW_1$-$SW_4$. Switch disabling controller 645 may be configured to provide functionality similar to those provided by the combination of switch disabling controller 150 and output set-point controller 160.

In yet other variations, the functions of switch disabling controller 150 and output set-point controller 160 may be performed in other ways. For example, the functions and/or circuits of switch disabling controller 150 and output set-point controller 160 may be integrated into switch circuit controller 130 or switch circuit 140, input circuit 120 may be configured to detect periods of relative silence and to provide a waveform signal that does not include switching during these periods, and/or the like.

While the above Detailed Description describes certain embodiments of the invention, and describes the best mode contemplated, no matter how detailed the above appears in text, the invention can be practiced in many ways. Details of the system may vary in implementation, while still being encompassed by the invention disclosed herein. As noted above, particular terminology used when describing certain features or aspects of the invention should not be taken to imply that the terminology is being redefined herein to be restricted to any specific characteristics, features, or aspects of the invention with which that terminology is associated. In general, the terms used in the following claims should not be construed to limit the invention to the specific embodiments disclosed in the specification, unless the above Detailed Description explicitly defines such terms. Accordingly, the actual scope of the invention encompasses not only the disclosed embodiments, but also all equivalent ways of practicing or implementing the invention under the claims.

I claim:

1. An amplifier, comprising:
an input circuit configured to receive an input signal and to provide a waveform signal according to the input signal;
a switch disabling controller configured to assert a switch disabling signal based on whether the input signal represents at least relative silence; and
a switch circuit controller configured to receive the waveform signal and the switch disabling signal, to drive a switch circuit according to the waveform signal while the switch disabling signal is de-asserted, and to hold a state of the switch circuit while the switch disabling signal is asserted; and wherein
a first switch node and a second switch node of the switch circuit are configured to be brought and/or be held to a set-point voltage when the input signal represents at least relative silence.

2. The amplifier of claim 1, further comprising:
an output set-point controller configured to bring and/or hold the first and second switch nodes towards and/or at the set-point voltage during at least a period in which the input signal represents at least relative silence.

3. The amplifier of claim 2, wherein the output set-point controller includes:
first and second switched voltage divider circuits respectively configured to selectively couple the first and second switch nodes to the set-point voltage; and
a timer configured to respectively control the selective coupling of the first and second switched voltage divider circuits to the first and second switch nodes.

4. The amplifier of claim 2, wherein the first and second switch nodes are either directly connectable to a speaker or connectable to the speaker through passive electronic components.

5. The amplifier of claim 1, further comprising:
the switch circuit configured to be driven by the switch circuit controller and drive an audio output signal to a speaker.

6. The amplifier of claim 5, wherein the switch circuit includes:
at least four switching devices configured as a complementary output stage.

7. The amplifier of claim 1, wherein the switch disabling controller is further configured to bring and/or hold the first and second switch nodes towards and/or at a set-point voltage during at least a period in which the input signal represents at least relative silence.

8. The amplifier of claim 1, wherein the switch disabling controller includes:
a counter configured to count a duration in which the input signal does not represent at least relative silence and to de-assert the switch disabling signal upon the count reaching a threshold value.

9. The amplifier of claim 1, wherein the switch disabling controller is configured to suppress noise associated with switching of the switch circuit during at least the period in which the input signal represents at least relative silence.

10. The amplifier of claim 1, wherein the input circuit is configured to receive the input signal as at least one of an analog or digital signal.

11. The amplifier of claim 1, wherein the input signal represents at least relative silence during at least a start-up period, a muted period, and a period during which the input signal represents a sound output level which, if driven to a speaker through the switch circuit controller, would produce a sound output level less than a threshold.

12. The amplifier of claim 1, wherein the amplifier is an AD modulated class D audio amplifier connectable to a bridge tied load.

13. The amplifier of claim 1, wherein the amplifier is configured as a high perceived audio quality and low perceived noise audio amplifier.

14. The amplifier of claim 1, wherein the amplifier is a self-oscillating class D amplifier.

15. The amplifier of claim 1, wherein the amplifier is at least one of a class A, class B, class AB, or class D amplifier.

16. A method of amplifying an input signal, comprising:
receiving the input signal;
generating a waveform signal based on the input signal;
determining, for a given time period, whether the input signal represents at least relative silence;
if the input signal is determined to not represent at least relative silence, driving an audio output, according to the waveform signal, to a speaker; and
if the input signal is determined to represent at least relative silence, bringing and holding terminals of the speaker to substantially a non-zero set-point voltage such that there is substantially no voltage differential across the speaker.

17. The method of claim 16, wherein the input signal is determined to represent at least relative silence during at least a start-up period, a muted period, and a period during which the input signal represents a sound output level which, if driven to the speaker, would produce a sound output level less than a threshold.

18. The method of claim 16, wherein the method is implemented in a self-oscillating AD modulated class D audio amplifier connected to the speaker in a bridge tied load configuration.

19. The method of claim 16, wherein the non-zero set-point voltage is approximately half of a complementary drive voltage that is employed to drive the audio output while the input signal is determined to not represent at least relative silence.

20. A low perceived switching noise audio amplifier, comprising:
means for receiving an input signal;
means for generating a waveform signal based on the input signal;
means for determining, for a given time period, whether the input signal represents at least relative silence;
means for driving an audio output, based on the waveform signal, to a speaker, while the input signal is determined to not represent at least relative silence; and
means for bringing and holding terminals of the speaker to substantially a non-zero set-point voltage such that there is substantially no voltage differential across the speaker, while the input signal is determined to represent at least relative silence.

* * * * *